(12) United States Patent
Krönke et al.

(10) Patent No.: US 6,515,891 B2
(45) Date of Patent: Feb. 4, 2003

(54) RANDOM ACCESS MEMORY WITH HIDDEN BITS

(75) Inventors: Matthias Krönke, Dresden (DE); Günther Schindler, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/996,260

(22) Filed: Nov. 28, 2001

(65) Prior Publication Data

US 2002/0089884 A1 Jul. 11, 2002

(30) Foreign Application Priority Data

Nov. 28, 2000 (DE) .......................... 100 58 965

(51) Int. Cl.[7] .............................................. G11C 11/22
(52) U.S. Cl. ..................................... 365/145; 365/149
(58) Field of Search ................................ 365/145, 149, 365/150

(56) References Cited

U.S. PATENT DOCUMENTS

| | | | | |
|---|---|---|---|---|
| 5,629,888 A | * | 5/1997 | Saito et al. ................. | 365/145 |
| 5,870,329 A | * | 2/1999 | Foss ............................ | 365/149 |
| 6,046,929 A | * | 4/2000 | Aoki et al. ................. | 365/145 |
| 6,229,730 B1 | * | 5/2001 | Kato ........................... | 365/145 |
| 6,285,575 B1 | * | 9/2001 | Miwa .......................... | 365/145 |
| 6,438,022 B2 | * | 8/2002 | Schlosser et al. .......... | 365/145 |

FOREIGN PATENT DOCUMENTS

DE   43 15 714 A1   11/1993

OTHER PUBLICATIONS

Search Report issued by the German Patent and Trademark Office on Sep. 27, 2001.

* cited by examiner

*Primary Examiner*—Tan T. Nguyen
(74) *Attorney, Agent, or Firm*—Laurence A. Greenberg; Werner H. Stemer; Ralph E. Locher

(57) ABSTRACT

A random access memory having a multiplicity of memory cells having logic states that can be changed by a control voltage. At least some of the memory cells include an additional device that can be activated by means of an enforced control voltage that is different from the control voltage, in order to impress a defined logic state on the memory cell.

10 Claims, 1 Drawing Sheet

RANDOM ACCESS MEMORY WITH HIDDEN BITS

BACKGROUND OF THE INVENTION

FIELD OF THE INVENTION

The invention relates to a random access memory (RAM) including a multiplicity of memory cells that each have a memory device with a memory content which establishes a logic state that can be changed by a control voltage.

In numerous applications, an electronic device, such as a personal computer, for example, requires a RAM having a defined memory content in order to start. In the case of a personal computer, this defined memory content is, for example, the operating system BIOS (Basic Input/Output System). During use, the memory content is generally overwritten and modified. Under special circumstances, for example, whenever rebooting of the device is required, the original memory state must be restored in the RAM. This has previously been accomplished by performing the time-consuming operation of rewriting the RAM from an external source. In the case of a personal computer, the rewriting would be performed from a hard disk. In the case of certain types of devices, for example, in portable applications, such as cellphones for instance, this rewriting operation usually cannot be accomplished by the user alone.

There is therefore a need to rewrite the contents of a RAM to the original memory state in a manner that can be accomplished at any time and at a high speed without a great amount of time having to be expended.

SUMMARY OF THE INVENTION

It is accordingly an object of the invention to provide a RAM which overcomes the above-mentioned disadvantages of the prior art apparatus of this general type.

With the foregoing and other objects in view there is provided, in accordance with the invention, a random access memory that includes a plurality of memory cells. Each one of the plurality of the memory cells has a first memory device with a memory content defining a logic state. Each one of the plurality of the memory cells receives a first control voltage for changing the memory content of the first memory device. At least some of the plurality of the memory cells have a second memory device with a memory content defining a logic state. Each one of the plurality of the memory cells which include a second memory device receive a second control voltage for impressing the logic state of the second memory device on the first memory device. The second control voltage is an enforced control voltage that is different from the first control voltage.

In accordance with an added feature of the invention, the RAM includes a plurality of word lines and a plurality of bit lines, and each one of the plurality of the memory cells is formed as a DRAM memory cell. The second memory device of one of the plurality of the memory cells having a second device is connected between one of the plurality of the word lines and one of the plurality of the bit lines, and the second control voltage is greater than the first control voltage.

In accordance with an additional feature of the invention, the second memory device of one of the plurality of the memory cells includes a diode with an adapted breakdown voltage.

In accordance with another feature of the invention, the second memory device of one of the plurality of the memory cells includes a transistor with an adapted turn-on voltage.

In accordance with a further feature of the invention, each one of the plurality of the memory cells has a second memory device. The second memory device of each one of the plurality of the memory cells can optionally be connected between one of the plurality of the word lines and one of the plurality of the bit lines.

In accordance with a further added feature of the invention, there is provided, a contact hole for connecting the second memory device of a selected one of the plurality of the memory cells between one of the plurality of the word lines and one of the plurality of the bit lines.

In accordance with a further additional feature of the invention, there is provided, an electronic fuse for connecting the second memory device of a selected one of the plurality of the memory cells between one of the plurality of the word lines and one of the plurality of the bit lines.

In accordance with a concomitant feature of the invention, each one of the plurality of the memory cells is formed as an FeRAM cell. One of the plurality of the memory cells includes a line, a first ferroelectric capacitor that defines the first memory device, a second ferroelectric capacitor that defines the second memory device and that is connected in parallel with the first ferroelectric capacitor, and a transistor. The second ferroelectric capacitor is connected between the transistor and the line. The first ferroelectric capacitor stores a logic state by applying a first activation voltage. The second ferroelectric capacitor stores a logic state by applying a second activation voltage. The first activation voltage is smaller than the second activation voltage. The logic state of the second ferroelectric capacitor is read out with the second control voltage, which is greater than the second activation voltage, in order to impress the logic state of the second ferroelectric capacitor on the first ferroelectric capacitor. The logic state of the first ferroelectric capacitor is variable with a control voltage that is greater than the first activation voltage and smaller than the second activation voltage. The logic state of the second ferroelectric capacitor is invariable.

In other words, "hidden bits" are used to store a defined memory content in the RAM itself in an easy and quickly recoverable manner. The invention specifically envisages storing an additional hidden bit at least in some of the memory cells of the RAM. This hidden bit may be defined, for example, by wiring or mask programming or else by the state of an additional ferroelectric storage capacitor.

Generally, the hidden bit is provided by an additional memory device in the memory cell of the RAM which can be activated by an enforced control voltage, which differs from the control voltage of the memory cell. What is important here is that an originally established memory content of the RAM can be recovered in a simple way by applying one and the same enforced control voltage to the memory cells concerned. The enforced control voltage ensures that the memory contents of the memory cells can be reset to the original contents at a higher speed than was previously possible by time-consuming rewriting of the memory content of the memory cells. The only precondition is that the enforced control voltage differs in a defined way from the control voltage with which the logic state of the memory cells of the RAM is usually changed or defined.

The modified RAM having hidden bits can be a DRAM or an FeRAM (Ferro-Electric Random Access Memory).

In the case of the DRAM, the additional memory device establishing the hidden bit includes an additional component between the word line and the bit line of the DRAM memory cell. The additional component is activatable by means of an enforced control voltage which is greater than the normal control voltage on the bit line. This additional component may either be a diode with an adapted breakdown voltage or a transistor with an adapted turn-on voltage.

To easily produce the RAM modified with hidden bits, all of its memory cells are preferably provided with the additional memory device in the form of the additional component, which can then optionally be connected to the word and bit lines. This optional connection preferably takes place by means of a contact hole, which is either made or not made.

In the case of a RAM in the form of an FeRAM, by contrast with the aforementioned DRAM, the information of a hidden bit can also be modified. This is achieved by connecting the additional memory device between the word line and the bit line of the DRAM memory cell and by providing first and second ferroelectric capacitors. The first and second ferroelectric capacitors each store a bit by applying an activation voltage Vc1 and Vc2 (Vc1<Vc2), respectively, by means of a selection transistor. It is possible for the bit (hidden bit) of the second ferroelectric capacitor C2 to be read out with a voltage (enforced control voltage) U>Vc2 in order to impress the defined logic state on the first capacitor during the subsequent rewriting of the memory cell. The bit of the first capacitor C1 is variable with a voltage Vc1<U<Vc2, but the bit of the capacitor C2 is invariable.

Other features which are considered as characteristic for the invention are set forth in the appended claims.

Although the invention is illustrated and described herein as embodied in a random access memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
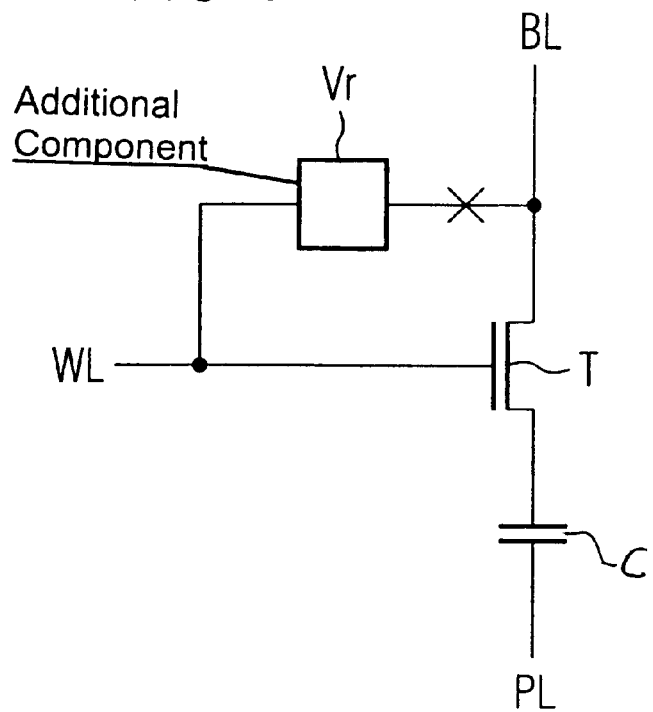
FIG. 1 schematically shows a memory cell of an inventive DRAM.

Referring now to the figures of the drawing in detail and first, particularly, to FIG. 1 thereof, there is shown an RAM that includes a word line WL, a bit line BL, and also a line PL (common plate line), which are linked in a conventional way to a selection transistor T. This construction of a DRAM cell corresponds to this extent to the standard cell construction. As an additional component, also referred to here as an "additional device", a component Vr is arranged between the word line WL and the bit line BL. The additional component Vr is intended to connect through with a voltage $U_v$, which lies above the normal operating voltage of the bit line BL.

Otherwise, the component Vr is to be high-ohmic. This component Vr may be, for example, in the form of a diode with an adapted breakdown voltage or a transistor with an adapted turn-on voltage.

By breaking and making the connection between the component Vr and the word line WL or the bit line BL, the logic state of a hidden bit is established. This operation is also referred to as mask programming and is indicated in FIG. 1 by a cross between the component Vr and the bit line BL. The connection may be established in this way, for example, by means of a contact hole, which, according to the desired memory content, is either provided or omitted.

Since the component Vr is normally high-ohmic, the memory cell of the DRAM shown behaves during operation in just the same way as a standard DRAM cell.

The DRAM contains a multiplicity of cells modified in this way, to which it is possible during normal operation to write information that can also be erased from corresponding cells. If it is required to reestablish the original memory state, for example, for rebooting a personal computer, the state of the multiplicity of the hidden bits is rewritten in the memory cells. For this purpose, first the entire memory, i.e. the multiplicity of memory cells, is written with a logic "0".

Then, a voltage $U>U_v$ is applied to the word line WL. On account of the voltage U, the component Vr connects through and a capacitor C is written with a logic "1". This operation applies exclusively to those memory cells which are electrically connected to the word and bit lines by the mask programming of the components Vr. The memory as a whole has the information of the hidden bits written to it, and consequently again has the original memory content.

This operation may also optionally be used to write to only some of the memory cells.

It is important that the writing operation according to the invention can be performed at a fast rate that is similar to that of a "refresh", and consequently is much faster than in the case when the original information is conventionally loaded from an external source, such as a hard disk, for example.

Figure 2:
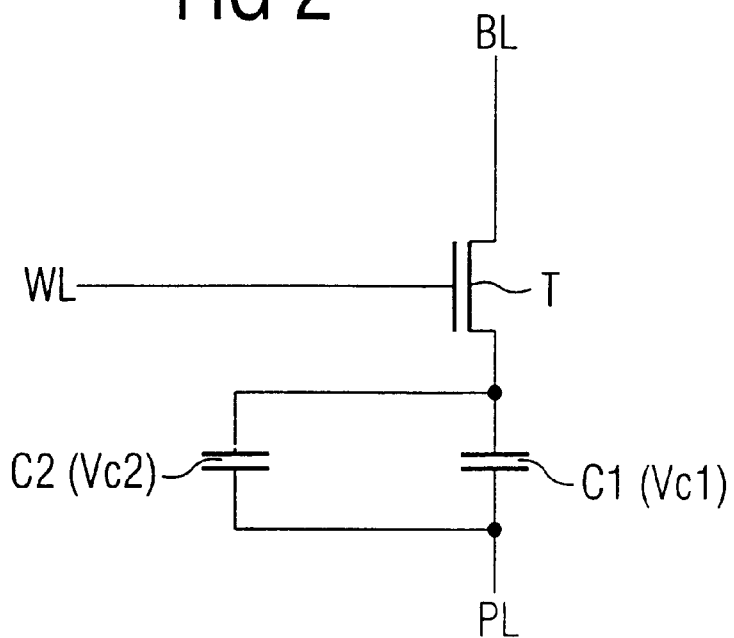
FIG. 2 schematically shows a memory cell of an inventive FeRAM.

FIG. 2 shows a FeRAM memory cell that has been modified according to the invention. The FeRAM memory cell includes a word line WL, a bit line BL, and a line PL (common plate line) that are each connected in a conventional way to a selection transistor. In this regard, the construction of the FeRAM cell corresponds to the construction of a standard cell. An additional component, also referred to as an "additional device", in the form of a second ferroelectric capacitor C2 is arranged between the selection transistor and the line PL of the cell, in parallel with a first ferroelectric capacitor C1 of the cell. The second ferroelectric capacitor C2 is provided in order to store and read out the information of a hidden bit in the cell when the information is intended to impress a defined logic state on the cell. This is achieved by the fact that, for the memory cell concerned, the two ferroelectric capacitors C1 and C2 are provided with different voltages Vc1 and Vc2 (Vc1<Vc2) for storing two bits per selection transistor T. The hidden bit is written in the second capacitor C2 with the higher Vc2. As long as only the first capacitor C1, which is used for the normal storing operation, is written to and read from with a voltage Vc1<U<Vc2, the information in the second capacitor C2 remains undisturbed (U control voltage of the FeRAM memory cell concerned). If it is intended for the hidden bit to be rewritten to the cell for the sake of recovering the original memory content, first the first capacitor C1 is brought into a defined state (polarity of the voltage applied to the first capacitor C1=polarity of the read-out voltage for the second capacitor C2), whereupon the second capacitor C2 is read out with a higher voltage U>Vc2. In the subsequently required rewriting operation, writing automatically also takes place to the first capacitor C1 and, as a result, the information of the hidden bit is written into the memory cell. Since the internal reading out and rewriting is carried out block by block with a specific number of memory cells, this method proceeds much faster than the previously used method of loading in external data, for example, from a hard disk.

We claim:

1. A random access memory, comprising:

a plurality of memory cells;

each one of said plurality of said memory cells having a first memory device with a memory content defining a logic state, each one of said plurality of said memory cells receiving a first control voltage for changing the memory content of said first memory device;

at least some of said plurality of said memory cells having a second memory device with a memory content defining a logic state;

each one of said some of said plurality of said memory cells receiving a second control voltage for impressing the logic state of said second memory device on said first memory device; and the second control voltage being an enforced control voltage that is different from the first control voltage.

2. The random access memory according to claim 1, comprising:

a plurality of word lines; and a plurality of bit lines;

each one of said plurality of said memory cells being formed as a DRAM memory cell;

said second memory device of one of said some of said plurality of said memory cells being connected between one of said plurality of said word lines and one of said plurality of said bit lines; and the second control voltage being greater than the first control voltage.

3. The random access memory according to claim 2, wherein said second memory device of said one of said some of said plurality of said memory cells includes a diode with an adapted breakdown voltage.

4. The random access memory according to claim 2, wherein said second memory device of said one of said some of said plurality of said memory cells includes a transistor with an adapted turn-on voltage.

5. The random access memory according to claim 4, comprising a contact hole for connecting said second memory device of said one of said some of said plurity of said memory cells between one of said plurality of said word lines and one of said plurality of said bit lines.

6. The random access memory according to claim 4, comprising an electronic fuse for connecting said second memory device of said one of said some of said plurality of said memory cells between one of said plurality of said word lines and one of said plurality of said bit lines.

7. The random access memory according to claim 2, wherein:

said at least some of said plurality of said memory cells includes all of said plurality of said memory cells so that each one of said plurality of said memory cells has said second memory device;

said second memory device of each one of said plurality of said memory cells can optionally be connected between one of said plurality of said word lines and one of said plurality of said bit lines.

8. The random access memory according to claim 7, comprising a contact hole for connecting said second memory device of a selected one of said plurality of said memory cells between one of said plurality of said word lines and one of said plurality of said bit lines.

9. The random access memory according to claim 7, comprising an electronic fuse for connecting said second memory device of a selected one of said plurality of said memory cells between one of said plurality of said word lines and one of said plurality of said bit lines.

10. The random access memory according to claim 1, wherein:

each one of said plurality of said memory cells is formed as an FeRAM cell;

one of said plurality of said memory cells includes a transistor, a line, a first ferroelectric capacitor that defines said first memory device, and a second ferroelectric capacitor that defines said second memory device and that is connected in parallel with said first ferroelectric capacitor;

said second ferroelectric capacitor is connected between said transistor and said line;

said first ferroelectric capacitor stores a logic state by applying a first activation voltage;

said second ferroelectric capacitor stores a logic state by applying a second activation voltage;

the first activation voltage is smaller than the second activation voltage;

the logic state of the second ferroelectric capacitor is read out with the second control voltage, which is greater than the second activation voltage, in order to impress the logic state of said second ferroelectric capacitor on said first ferroelectric capacitor;

the logic state of said first ferroelectric capacitor is variable with a control voltage that is greater than the first activation voltage and smaller than the second activation voltage; and the logic state of said second ferroelectric capacitor is invariable.

* * * * *